United States Patent

Nayak et al.

Patent Number: 5,973,370
Date of Patent: Oct. 26, 1999

[54] PREVENTING BORON PENETRATION THROUGH THIN GATE OXIDE OF P-CHANNEL DEVICES IN ADVANCED CMOS TECHNOLOGY

[75] Inventors: Deepak K. Nayak, Santa Clara; Ming-Yin Hao, Sunnyvale, both of Calif.

[73] Assignee: Advanced Micro Devices, Inc., Sunnyvale, Calif.

[21] Appl. No.: 09/266,849

[22] Filed: Mar. 12, 1999

Related U.S. Application Data

[62] Division of application No. 08/968,121, Nov. 12, 1997.

[51] Int. Cl.[6] .......................... H01L 29/76; H01L 29/94; H01L 31/062; H01L 31/113
[52] U.S. Cl. ..................... 257/371; 257/369; 257/374; 257/607; 257/913
[58] Field of Search ................................ 257/369, 371, 257/374, 607, 913

[56] References Cited

U.S. PATENT DOCUMENTS

| | | | |
|---|---|---|---|
| 4,764,478 | 8/1988 | Hiruta | 437/29 |
| 5,514,902 | 5/1996 | Kawasaki et al. | 257/607 |
| 5,796,166 | 8/1998 | Agnello et al. | 257/751 |

FOREIGN PATENT DOCUMENTS

| | | |
|---|---|---|
| 0789400 | 8/1997 | European Pat. Off. . |
| WO8500694 | 2/1985 | WIPO . |

OTHER PUBLICATIONS

Kase et al., "Eliminating Channeling Tail By Lower Dose Implantation," Mar. 26, 1990, Applied Physics Letters, vol. 56, NR. 13, pp. 1231–1232.

*Primary Examiner*—Ngân V. Ngô
*Attorney, Agent, or Firm*—Davis Chin

[57] ABSTRACT

A CMOS device and a method for forming the same is provided so as to overcome the problem of boron penetration through the thin gate oxide of P-channel devices. Silicon is implanted into the polysilicon gate electrode of the PMOS device functioning as a diffusion barrier for preventing boron penetration through the thin gate oxide and into the semiconductor substrate. As a result, the reliability of the CMOS device will be enhanced.

3 Claims, 3 Drawing Sheets

PREVENTING BORON PENETRATION THROUGH THIN GATE OXIDE OF P-CHANNEL DEVICES IN ADVANCED CMOS TECHNOLOGY

CROSS-REFERENCES TO RELATED APPLICATION

This application is a division of application Ser. No. 08/968,121 filed on Nov. 12, 1997.

BACKGROUND OF THE INVENTION

1. Field of the Invention

This invention relates generally to advanced CMOS technology and more particularly, it relates to a method for fabricating advanced CMOS integrated circuits so as to prevent boron penetration through thin gate oxide of P-channel devices.

2. Description of the Prior Art

As is generally well-known in the art of CMOS technology, a CMOS (complementary metal-oxide semiconductor) device is formed of an N-channel MOS device and a P-channel MOS device. In order to increase the speed of the CMOS devices, there has existed in the microelectronics industry over the last two decades an aggressive scaling-down of the channel length dimensions. However, as the channel length reduction occurs, the gate oxide thickness has to be likewise reduced down so as to avoid short channel effects.

Thus, there has been proposed heretofore of using a $p^+$-type polycrystalline silicon (poly-Si) gate so as to provide a surface channel feature in P-channel MOS devices in advanced CMOS structures. This is due to the fact that it is known that surface-channel P-channel MOS devices with $p^+$-type poly-Si gates can improve short-channel and sub-threshold I-V characteristics and produce better controllability of the threshold voltage. Typically, $BF_2^+$ ions are implanted simultaneously with the forming of the $p^+$ poly-Si gate and a $p^+$-n shallow junction. The presence of fluorine ions during the $BF_2$ implantation enhances the diffusion of boron ions. As a result, there will be a penetration of boron ions through the thin gate oxide (on the order of 20–50 Å) which introduces boron ions to the underlying silicon substrate. Boron penetration results unfortunately in degrading the reliability of the devices, such as positive shifts in the threshold voltage, increased sub-threshold swing, and increased electron trapping.

Accordingly, the problem of boron penetration through the thin gate oxide due to scaling-down has become one of the major concerns for advanced CMOS technology. There are known in the art of various techniques which have been used for suppressing boron penetration. One such method is the use of nitrogen implantation into the $p^+$ poly-Si gate. Another known method in the prior art is utilizing of an amorphous silicon gate. Also, still another known method involves the use of a stacked amorphous silicon/poly-Si gate. However, all of these aforementioned approaches suffer from the disadvantage of increasing the complexity of the conventional CMOS fabrication process. This is because of the different deposition process required for the poly as well as different etching processes needed to remove the poly.

In view of the foregoing, there still exists a method for fabricating advanced CMOS integrated circuits so as to prevent boron penetration through the thin gate oxide of P-channel devices, which require only minimal modification to the conventional CMOS fabrication process.

SUMMARY OF THE INVENTION

Accordingly, it is a general object of the present invention to provide a method for fabricating advanced CMOS integrated circuits so as to prevent boron penetration through the thin gate oxide of P-channel devices.

It is an object of the present invention to provide a method for fabricating advanced CMOS integrated circuits with a silicon implant so as to suppress the penetration effects of boron ions.

It is another object of the present invention to provide a method for fabricating advanced CMOS integrated circuits so as to prevent boron penetration which requires only minimal modification to the conventional CMOS fabrication process.

It is still another object of the present invention to provide a CMOS device having a silicon implant in the gate electrode of the P-channel device.

In accordance with a preferred embodiment of the present invention, there is provided a method for fabricating a CMOS device on a semiconductor substrate. Isolation regions are formed in the semiconductor substrate so as to separate a first active region and a second active region. A p-well region is formed in the first active region to be used for an N-channel MOS transistor. An n-well region is formed in the second active region to be used for a P-channel MOS transistor. A thin gate oxide is formed on a surface of the semiconductor substrate. A polysilicon layer is deposited on a surface of the gate oxide. The polysilicon layer and the gate oxide are patterned to form a first polysilicon gate electrode over the p-well region and a second polysilicon gate electrode over the n-well region.

N-type source/drain extension regions are formed on opposite sides of the first gate electrode in the p-well region. P-type source/drain extension regions are formed on opposite sides of the second gate electrode in the n-well region. Sidewall spacers are formed on each side of the first and second gate electrodes. N-type highly-doped source/drain regions are formed on opposite sides of the sidewall spacers of the first gate electrode. P-type highly-doped source/drain regions are formed on opposite sides of the sidewall spacers of the second gate electrode.

Silicon is implanted into the second polysilicon gate electrode so as to create a diffusion barrier for preventing boron penetration through the thin gate oxide and into the semiconductor substrate. The semiconductor substrate is annealed so as to activate the dopants in n-type and the p-type heavily-doped source/drain regions.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

As discussed above, the conventional CMOS fabrication process includes the problem of boron penetration when scaling-down. The purpose of the invention is to provide a method for preventing boron penetration through the thin gate oxide of P-channel devices in advanced CMOS technology. In view of this, the inventors of the instant invention have developed a way of using a simple silicon implantation step which is added to the conventional CMOS fabrication process in order to achieve this result. Accordingly, the required modification to the conventional CMOS fabrication process is minimal and thus does not increase significantly the manufacturing costs. As a background and in order to provide a better understanding of the present invention, a description for the conventional fabrication steps for making a CMOS device will hereinbelow be made initially along with the problem generated therefrom.

Figure 1A:
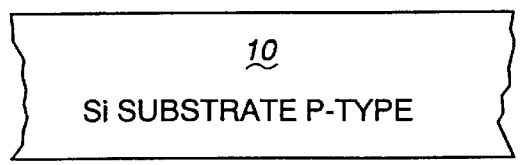
FIGS. 1(a) through 1(j) are cross-sectional views, illustrating the manufacturing steps for a conventional CMOS fabrication process.
Figure 1B:
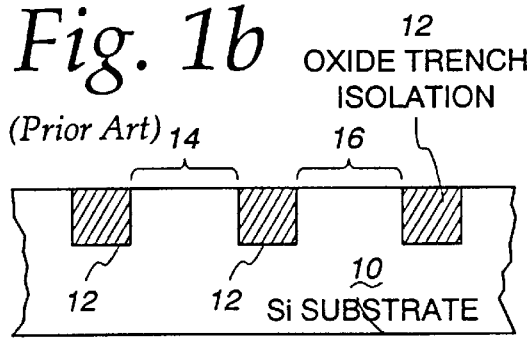
Figure 1C:
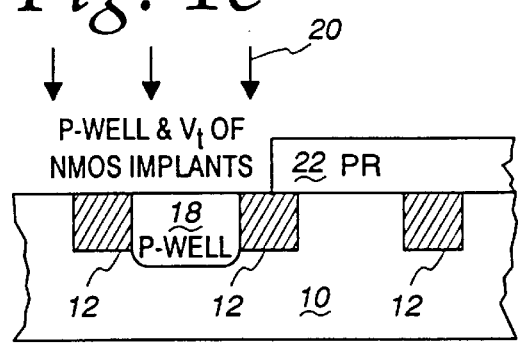
Figure 1D:
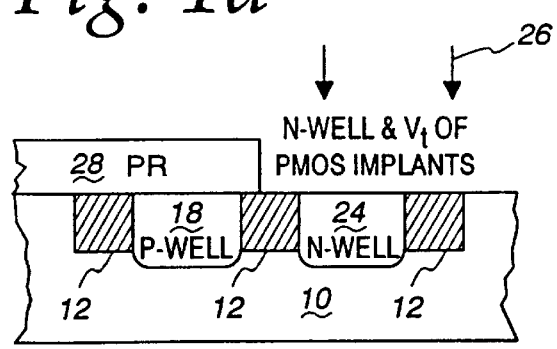

The conventional CMOS fabrication process will now be described with reference to the manufacturing steps shown in FIGS. 1(a) through 1(j) and labeled as "Prior Art." First, in FIG. 1(a), there is provided a P-type semiconductor substrate 10 such as silicon in which a plurality of isolation regions 12 are formed so as to separate active regions 14 and 16. This is illustrated in FIG. 1(b). Then, a p-well region 18 and a threshold $V_t$ implant for an NMOS device, as designated by dopant 20, are formed in the active region 14 by using a photoresist (PR) layer 22 as a mask, as illustrated in FIG. 1(c). Similarly, an n-well region 24 and a threshold $V_t$ implant for a PMOS device, as indicated by dopant 26, are formed in the active region 16 by using a photoresist layer 28 as a mask, as depicted in FIG. 1(d).

Figure 1E:
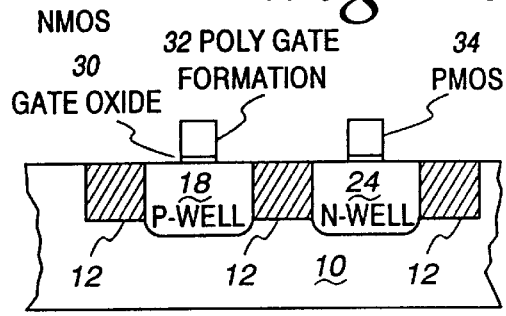
Figure 1F:
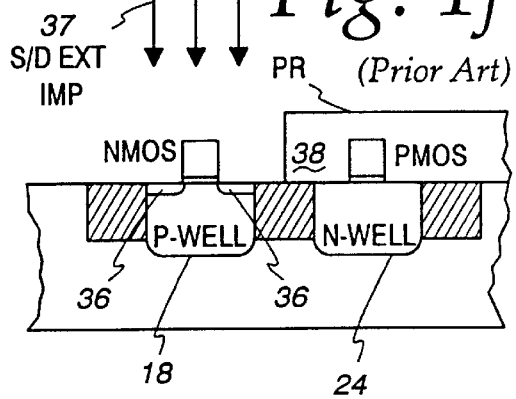
Figure 1G:
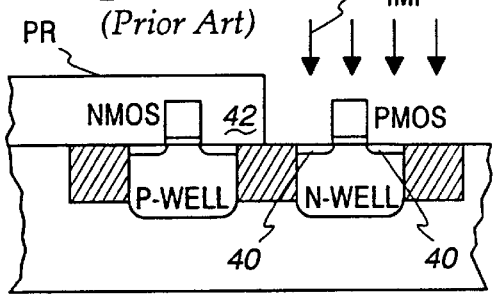

Then, a thin gate oxide 30 is grown on the top surface of the silicon substrate 10 covering the p-well and n-well regions 18 and 24. The thickness of the thin gate oxide 30 is typically on the order of 20–50 Å. Next, a polysilicon gate layer is formed over the surface of the gate oxide 30. Thereafter, the polysilicon layer and the gate oxide are patterned using conventional photolithography techniques followed by anisotropic dry etching so as to form gate electrodes 32 and 34, as depicted in FIG. 1(e). Next, lightly-doped source/drain (LDD) extensions 36 are implanted with arsenic (As) or phosphorous (P) ions 37 at a self-aligning position with the gate electrode 32 in the p-well region 18 on the silicon substrate 10 by using a photoresist layer 38 as a mask, as shown in FIG. 1(f). Similarly, lightly-doped source/drain (LDD) extensions 40 are implanted with boron ions 41 at a self-aligning position with the gate electrode 34 by using a photoresist layer 42 as a mask, as shown in FIG. 1(g).

Figure 1H:
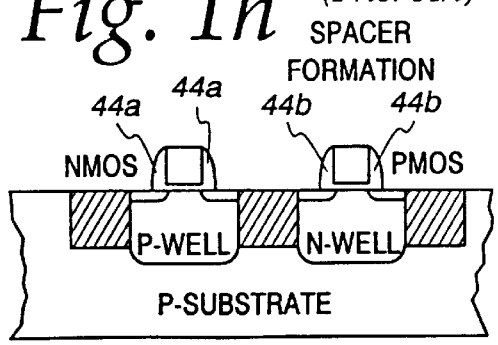
Figure 1I:
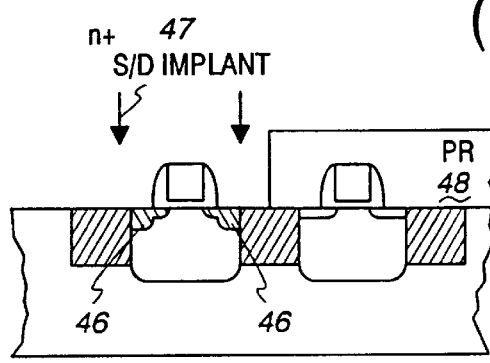
Figure 1J:
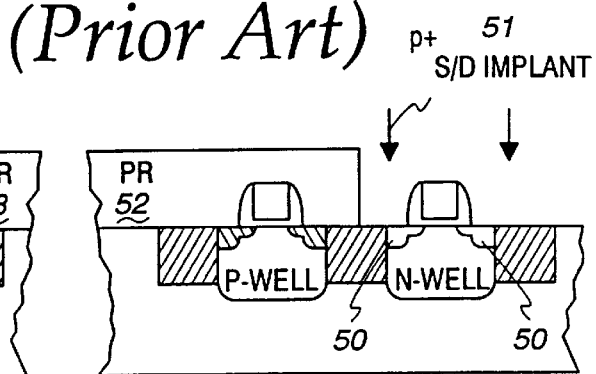

After the LDD implants 36 and 40, sidewall spacers 44a, 44b serving as insulating film are formed on each side of the respective gate electrodes 32 and 34 by etching, as illustrated in FIG. 1(h). Then, $n^+$ highly-doped source/drain regions 46 are implanted with arsenic or phosphorous ions 47 between the LDD extensions 36 and the p-well region 18 at self-aligning position with the sidewall spacers 44a using a photoresist layer 48 as a mask. This is shown in FIG. 1(I). Similarly, $p^+$ highly-doped source/drain regions 50 are implanted with boron (B) or $BF_2^+$ ions 51 between the LDD extensions 40 and the n-well region 24 at self-aligning position with the sidewall spacers 44b using a photoresist layer 52 as a mask. This is shown in FIG. 1(j). Following the $p^+$ source/drain implants 50, a furnace anneal or rapid thermal anneal (RTA) is performed (not shown) on the silicon substrate 10 to activate the dopants in the implanted regions 36, 46 and 40, 50. The subsequent remaining process flow steps of the conventional CMOS fabrication, such as passivation and metallization are quite conventional and thus will not be described.

As the size of the CMOS devices is being continuously scaled-down to smaller and smaller dimensions, the formation of the gate electrode 34 for the PMOS device in FIG. 1(e) is required to be a $p^+$-type polysilicon gate so as to impart the PMOS device with a surface channel feature. This is because surface-channel PMOS devices with $p^+$-type polysilicon gates are known to have better ability to avoid short channel effects. Ho,ever, $BF_2^+$ ions are typically implanted simultaneously when forming the $p^+$ polysilicon gate and the $p^+$-n shallow junction. Due to the fast diffusion of boron in the polysilicon gate 34 and within the thin gate oxide 30, boron will be penetrated through the thin gate oxide 30 to the underlying silicon substrate 10. Consequently, the CMOS device will have instability in device performance, such as a positive threshold voltage shift.

The inventors have developed a simple process of providing a silicon implant functioning as a diffusion barrier in the polysilicon gate to prevent the penetration through the thin gate oxide into the silicon substrate by the boron ions. This is achieved very economically by a silicon implant step, which does not require any additional equipment and can be performed with minimal modification to the existing CMOS fabrication process.

Figure 2:
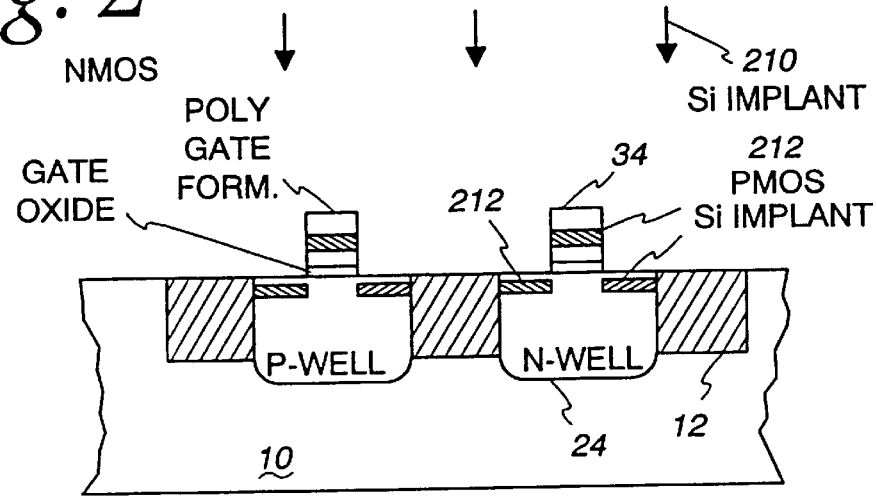
FIG. 2 is a cross-sectional view of a silicon implant step, according to a first embodiment of the present invention.

In FIG. 2 of the drawings, there is illustrated a preferred silicon implantation step which is implemented in accordance with a first embodiment of the present invention. This silicon implant step is performed immediately after the formation of the gate electrodes 32 and 34, as illustrated in FIG. 1(e), of the conventional CMOS fabrication process which is referred to as a blanket implant and is designated by the arrows 210. The silicon implant is performed with a dose of between $1\times10^{14}$ to $5\times10^{15}$ ions/cm$^2$ and at an energy in the range of 20–150 KeV. The dose is preferably $3\times10^{15}$ ions/cm$^2$ and the energy is at 100 KeV. It will be noted that no mask is required for the blanket implant.

As can be seen, silicon layers 212 will be formed in the polysilicon gate electrode 34 and in the surface of the n-well region 24 by the subsequent annealing performed after the step of FIG. 1(j). The silicon layers 212 in the polysilicon gate electrode 34 will function as a diffusion barrier for preventing $BF_2^+$ ions from penetrating through the thin gate oxide 30 to the underlying silicon substrate 10 during the $p^+$ source/drain implant 50 in the step of FIG. 1(j). Consequently, the PMOS devices reliability will be enhanced and other related properties, such as threshold voltage shift.

Figure 3:
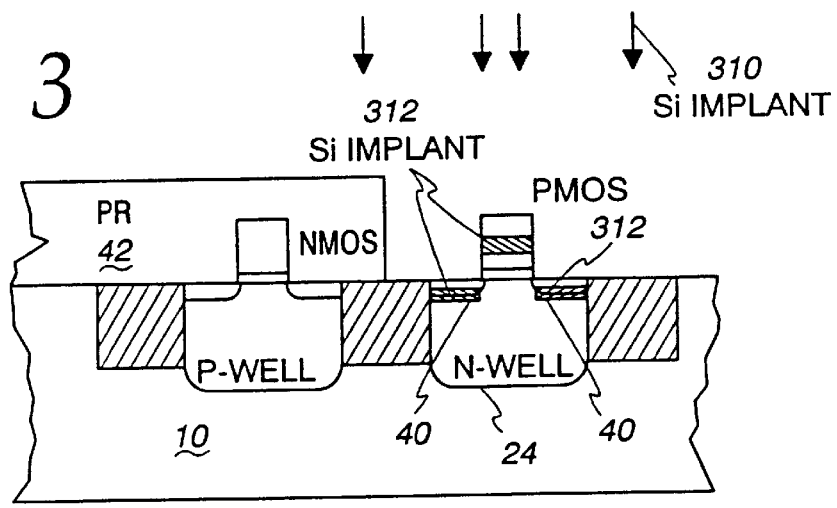
FIG. 3 is a cross-sectional view of a silicon implant step, according to a second embodiment of the present invention.

In FIG. 3, there is illustrated a preferred silicon implantation step which is implemented in accordance with a second embodiment of the present invention. This silicon implantation step is performed immediately after the implanting of the LDD regions 40 in the n-well region 24, as depicted in FIG. 1(g), of the conventional CMOS fabrication process and is indicated by the arrows 310. Again, the silicon implant is performed with a dose of between $1\times10^{14}$ to $5\times10^{15}$ ions/cm$^2$ and preferably with $3\times10^{15}$ ions/cm$^2$ with an energy of 20–150 KeV and preferably at 100 KeV. It will be noted that no extra mask is required since the same photoresist layer 42 for the LDD implants 40 in the n-well region 24 can be used. Again, silicon layers 312 will be formed in the polysilicon gate 34 and in the surface of the n-well region 24 by the subsequent annealing performed after the step of FIG. 1(j). Similarly, the silicon layer 312 will prevent $BF_2^+$ ions from penetrating through the thin gate oxide to the underlying silicon substrate.

Figure 4:
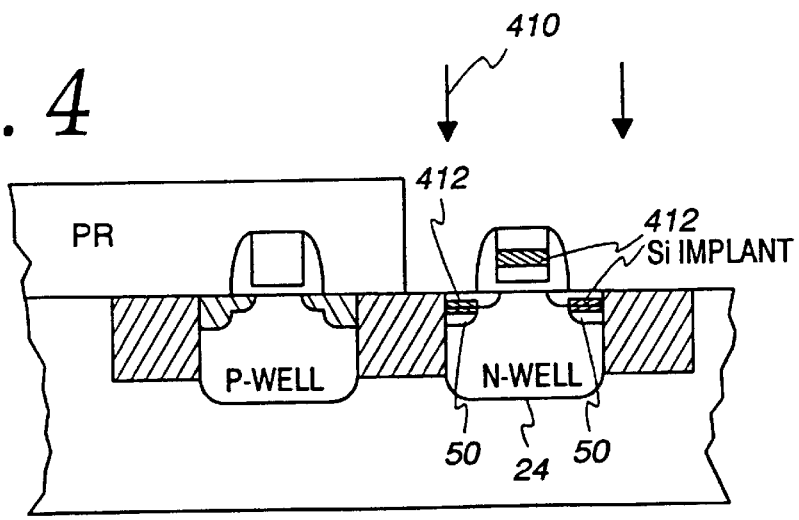
FIG. 4 is a cross-sectional view of a silicon implant step, according to a third embodiment of the present invention.

In FIG. 4, there is illustrated a preferred silicon implantation step which is implemented in accordance with a third embodiment of the present invention. This silicon implantation step is performed immediately after the $p^+$ source/drain implants 50 in the n-well region 24, as illustrated in FIG. 1(j), of the conventional CMOS fabrication process, but before the annealing step. Again, the silicon implantation is performed with a dose of between $3 \times 10^{14}$ to $5 \times 10^{15}$ ions/cm$^2$ or preferably with $3 \times 10^{15}$ ions/cm$^2$ with an energy in the range of 20–150 KeV or preferably 100 KeV. Again, it will be noted that since the same photoresist layer 52 for the $p^+$ source/drain implants 50 in the n-well region 24 can be used there is required no extra mask. As can be seen, silicon layers 412 will be formed in the polysilicon gate electrode 34 and in the surface of the n-well region 24 by the subsequent annealing performed after the step of FIG. 1(j). When the silicon implant is performed subsequent to the step of FIG. 1(j), it should be understood by those skilled in the art that an annealing process may optionally be performed after the step of FIG. 1(I) so to activate the dopants in the P-well region 18.

Figure 5:
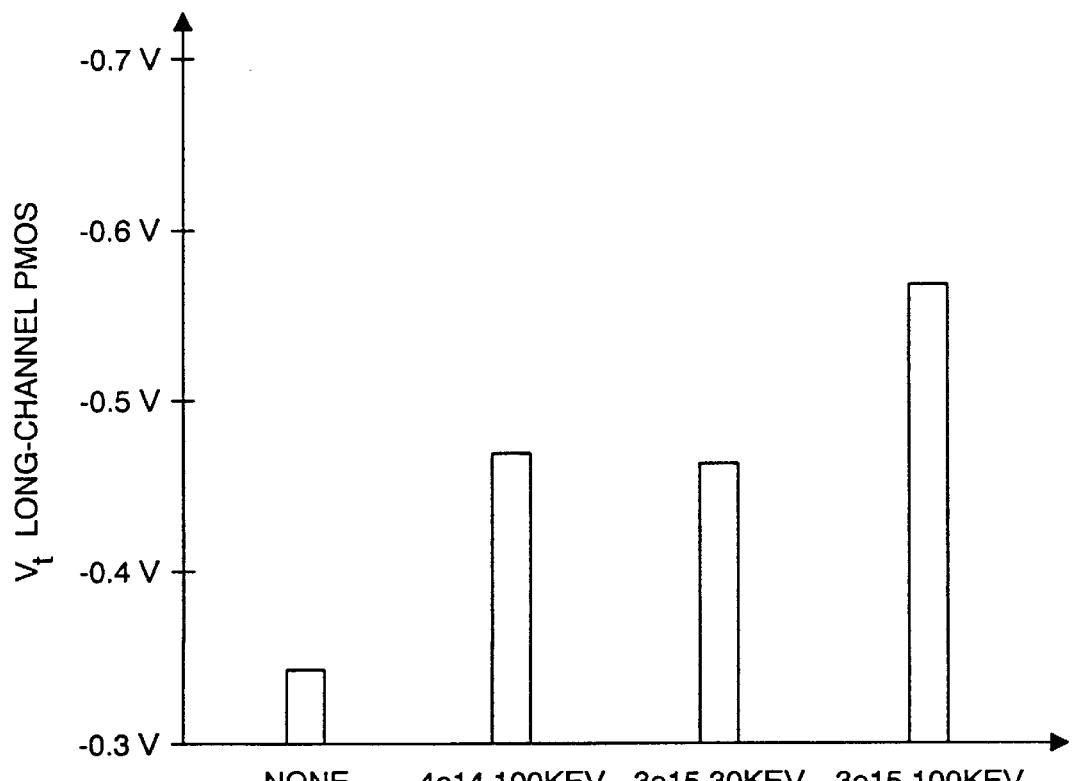
FIG. 5 is a graph of the experimentally measured threshold voltages of P-channel MOS devices as a function of silicon implant conditions.

In order to demonstrate the prevention of boron penetration in the CMOS devices by the implantation of the silicon layer in accordance with the manufacturing steps of the present invention, in FIG. 5 the experimentally measured threshold voltage $V_t$ of PMOS devices is plotted as a function of silicon implant conditions. As will be noted, the threshold voltage of PMOS devices with the silicon implantation have a higher absolute value than the PMOS device without any silicon implantation. In particular, it will be noted that the CMOS devices with no silicon implantation in curve A have a threshold voltage of approximately −0.35 volts. On the other hand, the PMOS devices having a silicon implant with a dose of $3 \times 10^{15}$ ions/cm$^2$ and with an energy of 100 KeV in curve B have a threshold voltage of approximately −0.58 volts. By comparing curves A and B, this implies that the effect of boron penetration has been minimized.

From the foregoing detailed description, it can thus be seen that the present invention provides a method of fabricating a CMOS device on a semiconductor substrate so as to prevent boron penetration through the thin gate oxide of P-channel devices. A silicon layer functioning as a diffusion barrier is formed in the polysilicon gate electrode so as to prevent boron ion penetration through the thin gate oxide to the underlying silicon substrate.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

We claim:

1. A CMOS device formed on a semiconductor substrate comprising:

isolation regions formed in said semiconductor substrate so as to separate a first active region and a second active region;

a p-well region formed in said first active region;

an n-well region formed in said second active region;

a thin gate oxide formed on a surface of said semi conductor substrate;

a first polysilicon gate electrode formed over said p-well region;

a second polysilicon gate electrode formed over said n-well region;

n-type source/drain extension regions formed in said p-well region on opposite sides of said first gate electrode;

p-type source/drain extension regions formed in said n-well region on opposite sides of said second gate electrode;

sidewall spacers formed on each side of said first and second gate electrodes;

n-type highly-doped source/drain regions formed in said p-well region on opposite sides of said sidewall spacers of said first gate electrode;

p-type highly-doped source/drain regions formed in said n-well region on opposite sides of said sidewall spacers of said second gate electrode; and a silicon implant formed in said second polysilicon gate electrode so as to create a diffusion barrier for preventing boron penetration though said thin gate oxide and into said semiconductor substrate.

2. A CMOS device as claimed in claim 1, wherein said thin gate oxide has a thickness in the range of 20–50 Å.

3. A CMOS device as claimed in claim 1, wherein said semiconductor substrate is a p-type silicon substrate.

* * * * *

UNITED STATES PATENT AND TRADEMARK OFFICE
CERTIFICATE OF CORRECTION

PATENT NO : 5,973,370
DATED : October 26, 1999
INVENTOR(S): Deepak K. Nayak et al.

It is certified that error appears in the above-identified patent and that said Letters Patent is hereby corrected as shown below:

Column 4, line 16, change "Ho,ever" to -- However --.

Column 6, line 23, change "semi" to -- semi- --.

Signed and Sealed this

Seventh Day of March, 2000

Attest:

Q. TODD DICKINSON

Attesting Officer

Commissioner of Patents and Trademarks